United States Patent
Houg

(10) Patent No.: US 8,086,913 B2
(45) Date of Patent: Dec. 27, 2011

(54) METHODS, APPARATUS, AND SYSTEMS TO REPAIR MEMORY

(75) Inventor: Todd Houg, St. Francis, MN (US)

(73) Assignee: Micron Technology, Inc., Boise, ID (US)

( * ) Notice: Subject to any disclaimer, the term of this patent is extended or adjusted under 35 U.S.C. 154(b) by 361 days.

(21) Appl. No.: 12/209,060

(22) Filed: Sep. 11, 2008

(65) Prior Publication Data

US 2010/0064186 A1    Mar. 11, 2010

(51) Int. Cl.
*G11C 29/00* (2006.01)

(52) U.S. Cl. .................................... 714/710; 714/711

(58) Field of Classification Search ............... 714/710, 714/711, 718, 723
See application file for complete search history.

(56) References Cited

U.S. PATENT DOCUMENTS

| | | | |
|---|---|---|---|
| 4,727,516 A * | 2/1988 | Yoshida et al. ............... 365/200 |
| 4,937,790 A * | 6/1990 | Sasaki et al. ............. 365/230.01 |
| 5,195,057 A * | 3/1993 | Kasa et al. .................... 365/200 |
| 5,233,614 A * | 8/1993 | Singh ............................ 714/723 |
| 5,347,428 A | 9/1994 | Carson et al. |
| 5,432,729 A | 7/1995 | Carson et al. |
| 5,807,791 A | 9/1998 | Bertin et al. |
| 5,815,427 A | 9/1998 | Cloud et al. |
| 5,914,953 A | 6/1999 | Krause et al. |
| 5,943,692 A | 8/1999 | Marberg et al. |
| 6,046,945 A | 4/2000 | Su et al. |
| 6,047,002 A | 4/2000 | Hartmann et al. |
| 6,081,463 A | 6/2000 | Shaffer et al. |
| 6,154,851 A | 11/2000 | Sher et al. |
| 6,201,733 B1 | 3/2001 | Hiraki et al. |
| 6,438,029 B2 | 8/2002 | Hiraki et al. |
| 6,574,757 B1 * | 6/2003 | Park et al. ...................... 714/710 |
| 6,661,712 B2 | 12/2003 | Hiraki et al. |
| 6,754,117 B2 | 6/2004 | Jeddeloh |
| 6,778,404 B1 | 8/2004 | Bolken et al. |
| 6,791,832 B2 | 9/2004 | Budny et al. |
| 6,822,912 B2 * | 11/2004 | Shimizu et al. ............... 365/200 |
| 7,124,200 B2 | 10/2006 | Sato et al. |
| 7,200,021 B2 | 4/2007 | Raghuram |

(Continued)

FOREIGN PATENT DOCUMENTS

EP    0606653 A1    7/1994

(Continued)

OTHER PUBLICATIONS

"Terrazon 3D Stacked Microcontroller with DRAM—FASTACK 3D Super-8051 Micro-controller", http://www.tezzaron.com/OtherICs/Super_8051.htm, (Link sent Oct. 2, 2007), 2 pgs.

(Continued)

*Primary Examiner* — Jeffrey A Gaffin
*Assistant Examiner* — Steve Nguyen
(74) *Attorney, Agent, or Firm* — Schwegman, Lundberg & Woessner, P.A.

(57) ABSTRACT

Methods, apparatus and systems pertain to performing READ, WRITE functions in a memory which is coupled to a repair controller. One such repair controller could receive a row address and a column address associated with the memory and store a first plurality of tag fields indicating a type of row/column repair to be performed for at least a portion of a row/column of memory cells, and a second plurality of tag fields to indicate a location of memory cells used to perform the row/column repair.

20 Claims, 5 Drawing Sheets

U.S. PATENT DOCUMENTS

| | | | |
|---|---|---|---|
| 7,415,640 B1 * | 8/2008 | Zorian et al. | 714/711 |
| 7,623,365 B2 | 11/2009 | Jeddeloh | |
| 7,734,966 B1 * | 6/2010 | Lee et al. | 714/718 |
| 2004/0250046 A1 | 12/2004 | Gonzalez et al. | |
| 2007/0075734 A1 | 4/2007 | Ramos et al. | |
| 2009/0132876 A1 * | 5/2009 | Freking et al. | 714/723 |
| 2009/0210600 A1 | 8/2009 | Jeddeloh | |

FOREIGN PATENT DOCUMENTS

| | | |
|---|---|---|
| WO | WO-2009105204 A2 | 8/2009 |
| WO | WO-2009105204 A3 | 8/2009 |

OTHER PUBLICATIONS

"Terrazon 3D Stacked DRAM Bi-STAR Overview", http://www.tezzaron.com/memory/Overview_3D_Dram.htm, (Link sent Oct. 2, 2007), 1 pg.

"Terrazon FaStack Memory—3 D Memory Devices", http://www.tezzaron.com/memory/Overview_3D_Dram.htm, (Link sent Oct. 2, 2007 Downloaded Oct. 27, 2007), 3 pgs.

Gann, Keith, D., "Neo-stacking technology", *Irvine Sensors Corporation News Release*, (Mar. 2007), 4 pgs.

* cited by examiner

METHODS, APPARATUS, AND SYSTEMS TO REPAIR MEMORY

BACKGROUND

Semiconductor memory devices, including Dynamic Random Access Memories (DRAMs), Static Random Access Memories (SRAMs), Electrically Erasable Programmable Read Only Memories (EEPROMs), and the like typically include an array of memory cells. The array of memory cells are arranged in rows and columns and store information in at least two states, for example, a logic high state (a logic "1" state) or a logic low state (a logic "0" state). To access this state information, a unique address is employed. The address is based on row/column locations and is decoded by address decode circuitry, which identifies the particular row and column of the memory array.

In manufacturing such memories, it is found that some of the memory cells can be defective. To repair these defective memory cells, memory devices provide redundant blocks of memory cells that can be used to replace, for example, an entire row of memory cells in which the defective cells are located. Often, only a minority of memory cells in a row are found to be defective. There is a need in the art for an efficient way of repairing memory cells.

BRIEF DESCRIPTION OF THE DRAWINGS

Various embodiments of the present invention are described in detail below with reference to the following drawings.

DETAILED DESCRIPTION

Figure 1:
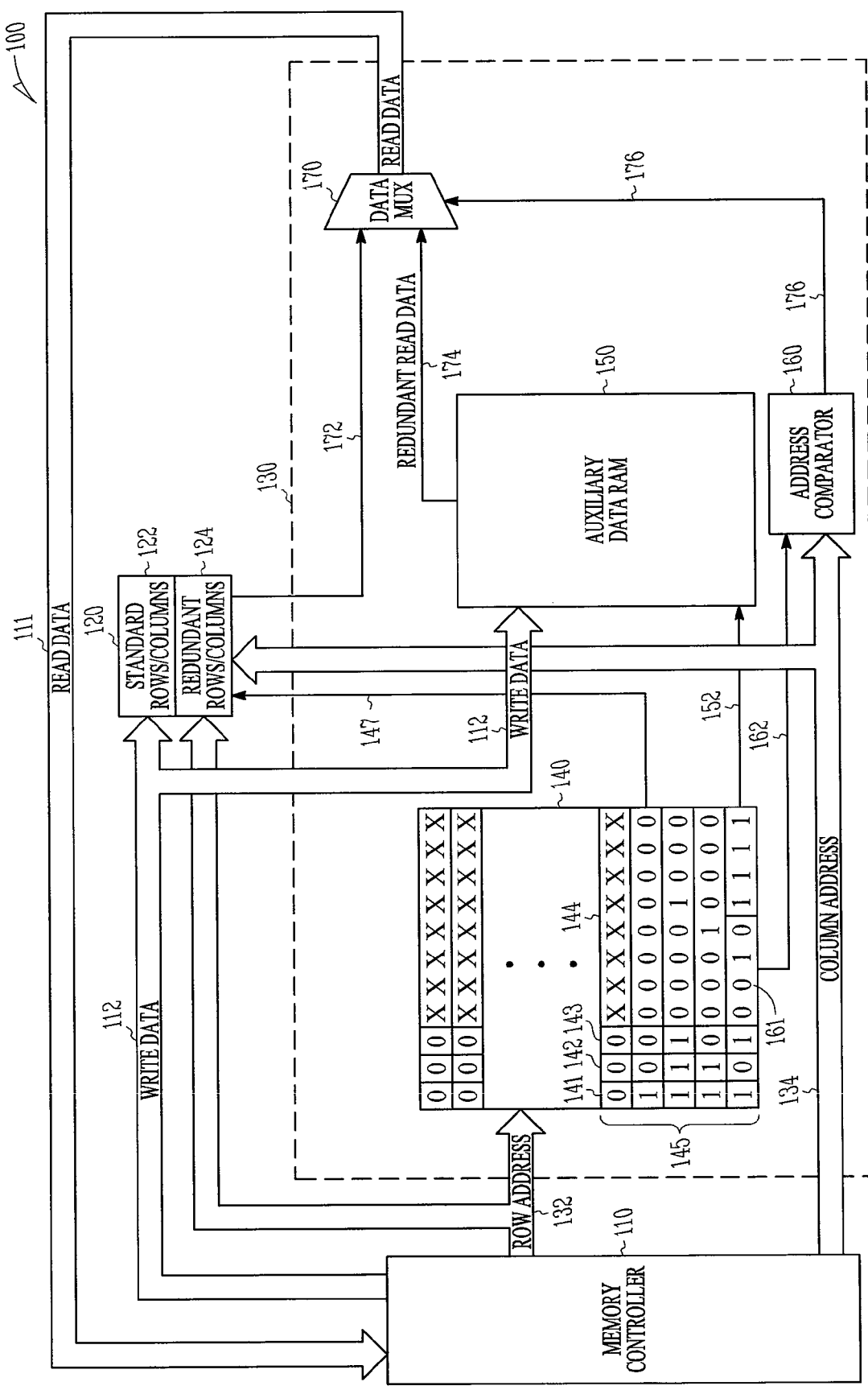
FIG. 1 is a schematic representation of a system for repairing a primary memory using a repair controller having a tag random access memory (RAM) and an auxiliary redundant data RAM, in accordance with some embodiments of the invention.

FIG. 1 is a schematic representation of a system 100 for repairing a primary memory using a repair controller, according to some embodiments of the invention. System 100 includes a memory controller 110, a primary memory 120, and a repair controller 130. In some embodiments, memory controller 110 is communicatively coupled to the primary memory 120 and the repair controller 130. In some embodiments, repair controller 130 and primary memory 120 reside within the same integrated circuit (IC) package. In some embodiments, repair controller 130 and primary memory 120 are located in the same package and in some other examples, they may be located in separate packages or dice. In some embodiments, the memory controller 110 may reside on the same die as primary memory 120. In some embodiments, the memory controller 110 may reside on the same die as the repair controller 130.

In some embodiments, when row repairs are performed in the primary memory 120, memory controller 110 provides row addresses and column addresses to repair controller 130 using links (or buses) 132 and 134, respectively. In some embodiments, the row addresses and the column addresses are transported over the same physical bus. In some embodiments, the row/column addresses are transported using multiplexed row/column addressing. In some embodiments, when column repairs are performed in the primary memory 120, memory controller 110 provides column addresses and row addresses to the repair controller 130 using links 132 and 134, respectively. Memory controller 110 receives read data using data bus 111 and sends write data using data bus 112.

Primary memory 120 includes a standard memory block 122 having rows/columns of memory cells, and a redundant memory block 124 having rows/columns of memory cells. The memory cells in the redundant memory block 124 can be used to repair defective cells within the standard memory block 122 that have been identified as being defective at the time of manufacturing of the primary memory 120. In various embodiments, primary memory 120 includes a stack of one or more DRAM arrays, wherein each DRAM array includes a standard block of memory cells and a redundant block of memory cells. In various embodiments, primary memory 120 includes a stack of one or more SRAM arrays, wherein each SRAM array includes a standard block of memory cells and a redundant block of memory cells. In some embodiments, the DRAM and SRAM arrays may include one or more blocks of standard memory cells and one or more blocks of redundant memory cells. In various embodiments, primary memory 120 includes a stack of one or more non-volatile arrays, wherein each non-volatile array includes a standard block of memory cells and a redundant block of memory cells. In some embodiments, the non-volatile memory is a flash memory. In some embodiments, primary memory 120 can include a combination of the different types of memory arrays mentioned above (for example, DRAM, SRAM, non-volatile, flash, etc.).

In some embodiments, repair controller 130 includes a tag RAM 140, an auxiliary data RAM 150, an address comparator 160 and a selector 170, which includes a Data Mux. In some embodiments, auxiliary data RAM 150 provides additional memory cells that can be used to repair defective memory cells of primary memory 120. In various examples, defective memory cells include cells that are actually defective and cells that have been deemed defective regardless whether they are actually defective. In some embodiments, tag RAM 140 includes repair tags 145 having repair tag fields 141-143 and redundant memory cell location field 144.

Table 1 shows an example of repair tag fields 141-143 that can be used for performing row/column repair. Repair tag fields 141-143 are used to store, for example, status information indicating whether a row repair is needed for a particular incoming row address. Additionally, if a row repair is desired then the repair tag fields can provide information on the type of repair required for each row address received from memory controller 110. In some embodiments, a repair tag field 141 (which is an optional field) includes a row repair indicator. In some embodiments, repair tag field 142 includes a redundant row locator. In some embodiments, repair tag field 143 includes a complete/partial row repair indicator. Redundant memory cell location field 144 is used to store the address of rows in either the primary memory 120 or the auxiliary data RAM 150, which are used to store data associated with the defective memory cells in primary memory 120. Tag RAM 140 uses data bus 152 to communicate the contents of the redundant memory cell location field 144 to the auxiliary data RAM 150.

TABLE 1

| Row Repair Indicator (141) | Redundant Row Locator (142) | Complete/Partial Row Repair Indicator (143) | Description of the type of row repair |
|---|---|---|---|
| 0 | 0 | 0 | No row repair required |
| 1 | 1 | 0 | Complete row/column repair performed using memory cells located in the repair controller |
| 1 | 1 | 1 | Partial row/column repair performed using memory cells located in the repair controller |
| 1 | 0 | 0 | Complete row/column repair performed using memory cells in the primary memory |
| 1 | 0 | 1 | Partial row/column repair performed using memory cells in the primary memory |

As shown in Table 1, in some embodiments, a bit value of "0" assigned to the row repair indicator 141 represents that no row/column repair would be needed for the memory cells corresponding to the row address presented to the tag RAM on row address 132. In some embodiments, a bit value of "1" assigned to the row repair indicator 141 represents that a row/column repair would be required for the memory cells corresponding to the incoming address.

In some embodiments, a bit value of "0" assigned to the redundant row locator 142 represents that row/column repair would be performed using the redundant rows/columns in redundant memory block 124 in primary memory 120. On the other hand, a bit value of "1" assigned to the redundant memory cell locator 142 represents that a row/column repair is performed using redundant rows/columns available in auxiliary data RAM 150.

In some embodiments, a bit value of "0" assigned to the complete/partial row repair indicator 143 represents that a complete row/column repair would be performed for the memory cells corresponding to the row address. In some embodiments, a bit value of "1" assigned to the complete/partial row repair indicator 143 represents that a partial row/column repair would be performed for a subset of memory cells corresponding to the related row/column address.

As shown in FIG. 1, selector 170 provides READ data to memory controller 110 using data bus 111. Data bus 172 provides the data retrieved from primary memory 120 to the selector 170. Data bus 174 provides data retrieved from auxiliary redundant data RAM 150 to the selector 170. Column address comparator 160 receives a string of bits from tag RAM 140 via data bus 162 that indicates the column position of a defective memory cell for a given row of memory cells identified by the tag RAM 140. Column address comparator 160 compares the string of bits received from tag RAM 140 with the column address received on data bus 134 from memory controller 110 and generates the control signal 176, which instructs selector 170 to select the READ data from either the primary memory 120 or auxiliary redundant data RAM 150. In some embodiments, control signal 176 allows the selector 170 to provide READ data by selecting the data between data bus 172 and data bus 174 based on control signal 176.

One of ordinary skill in the art will readily recognize that memory system 100 may include other parts, which are omitted from FIG. 1 to more clearly focus on the various embodiments described herein.

Figure 2:
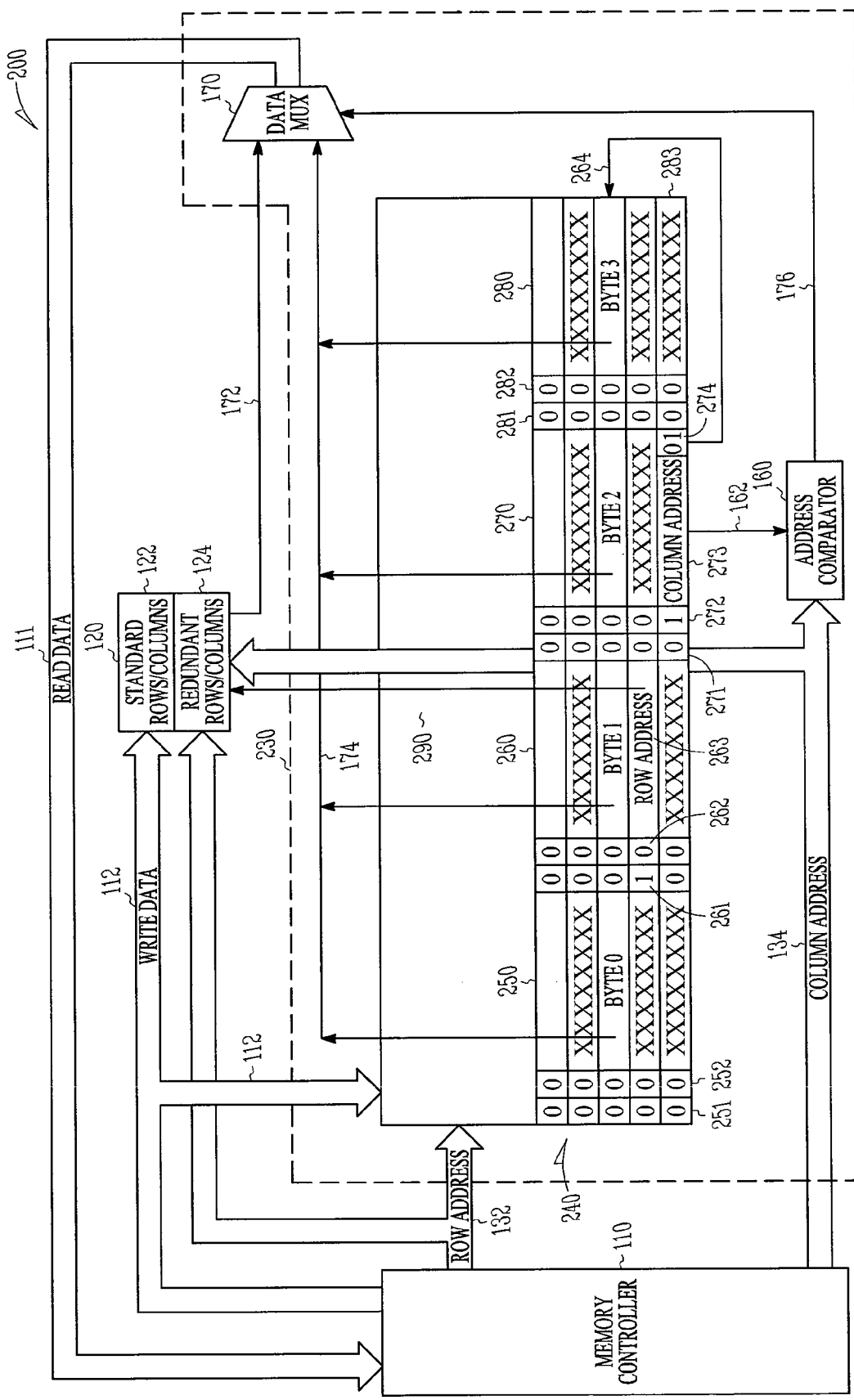
FIG. 2 is a schematic representation of a system for repairing a primary memory using a repair controller, in accordance with some embodiments of the invention.

FIG. 2 is a schematic representation of a system 200 for repairing a primary memory using a repair controller, according to some embodiments of the invention. System 200 includes the memory controller 110 coupled to a repair controller 230 and a primary memory 120. In some embodiments, the repair controller 230 includes a tag RAM 240, a column address comparator 160 and a selector 170.

Table 2 shows an example of the different types of row repair tags available for a particular row address received from memory controller 110.

TABLE 2

| Complete Row Repair Indicator (251, 261, 271, 281) | Partial Row Repair Indicator (252, 262, 272, 282) | Description of Row Repair |
|---|---|---|
| 0 | 0 | No repair required |
| 1 | 0 | Complete row repair performed using memory cells located in primary memory |
| 0 | 1 | Partial row repair performed from memory cells located in the repair controller |

In some embodiments, tag RAM 240 includes groups of repair tags (250, 260, 270, and 280). As shown in FIG. 2, one of the rows in group 270 includes a complete row repair indicator field 271, a partial row repair indicator field 272, an address field 273, and offset field 274.

In some embodiments, tag RAM 240 is configured to provide redundant memory cells using memory cells used to store memory addresses associated with rows/columns that do not need any row/column repair.

In some embodiments, a bit value of "0" assigned to the complete row repair indicator field 271 represents that no complete row repair is required. On the other hand, a bit value of "1" assigned to the complete row repair indicator field 271 represents that a complete row repair is required and the repair is performed using memory cells from the primary memory 120.

In some embodiments, a bit value of "0" assigned to the partial row repair indicator field 272 represents that no partial row repair is to be performed. On the other hand, a bit value of "1" assigned to the partial row repair indicator field 272 represents that a partial row repair is to be performed. The partial row repair is performed using memory cells in the tag RAM 240.

In some embodiments, address field 273 provides the location of defective memory cells within a row address provided by memory controller 110. In one example, an offset field 274 stores information (such as an offset to column repair data location) for a pointer 264 to locate the memory cells within the tag RAM 240 that stores the data. In one example, offset field 274 stores values to locate redundant memory cells in tag RAM 240 that can be used to replace defective memory cells identified by address field 273.

In one example, complete row repair indicator 261 indicates a complete row repair to be performed from the redundant rows in primary memory. In one example, a redundant row address field 263 is used to create a pointer 290 to locate the redundant row in primary memory 120.

Figure 3:
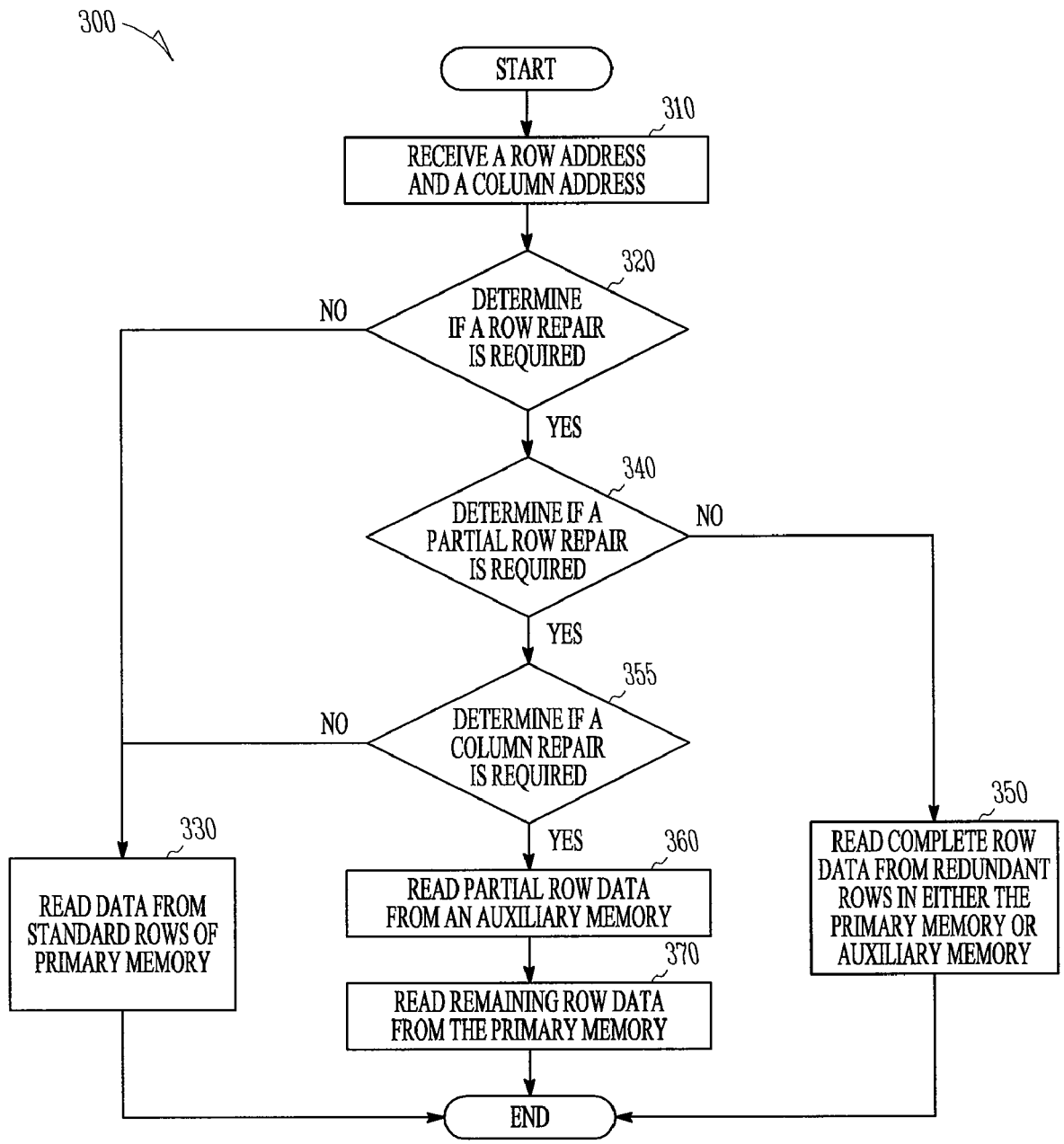
FIG. 3 is a flow chart of a method of repairing a primary memory during a READ operation using the system shown in FIG. 1, according to some embodiments of the invention.

FIG. 3 is a flow chart 300 of a method of repairing a primary memory during a READ operation using the system shown in FIG. 1, according to some embodiments of the invention.

At block 310, method 300 includes receiving a row address and a column address associated with primary memory 120. In some embodiments, at block 310 method 300 includes having the memory controller 110 provide a row address associated with primary memory 120 to tag RAM 140 using link 132 as shown in FIG. 1.

At block 320, method 300 includes determining if a row repair is required. In some embodiments, determining if a row repair is required includes checking a repair tag field 141 of a repair tag 145 associated with the received row address. In an example, if the repair tag field 141 bit has a "0" assigned to it, then the row address is determined to have no defective memory cells in the row and as a result no repair is necessary for that particular row. On the other hand, if the repair tag field 141 has a "1" assigned to it, then the row address is determined to have defective memory cells in it. Upon determining if a row repair is required at block 320, method 300 proceeds to block 330 if no repair is required, or proceeds to block 340 if a row repair is required.

At block 330, method 300 includes performing a READ operation from standard memory block 122 in primary memory 120. Method 300 terminates after the READ data operation is completed.

At block 340, method 300 includes determining if a partial row repair is required. In some embodiments, determining if a partial row repair is required includes checking a repair indicator 143 of a repair tag 145 associated with the received row address. In an example, if the repair indicator 143 bit has a "0" assigned to it, then the row address is determined to require a complete row repair. On the other hand, if the repair indicator 143 has a "1" assigned to it, then the row address is determined to require a partial row repair. Upon determining the type of repair (complete repair versus partial repair) at block 340, method 300 proceeds to block 350 if a complete repair is required. On the other hand, if a partial row repair is required, method 300 proceeds to block 355.

At block 350, method 300 includes performing a READ operation wherein a row of data is read from either the redundant block of memory cells in the primary memory 120 or the auxiliary memory such as auxiliary data RAM 150 as determined by the state of redundant row locator 142.

At block 355, method 300 includes determining if a column repair is required. In one example, determining if a column repair is required includes comparing incoming column address 134 to bad column address field 161 to determine if a column repair is required. In an example, if a column repair is required, then method 300 proceeds to block 360. On the other hand, if no column repair is required, then method 300 proceeds to block 330.

At block 360, method 300 includes performing a READ operation using partial rows retrieved from auxiliary redundant data RAM 150. Upon performing the partial row read operation, method 300 proceeds to block 370.

At block 370, method 300 includes performing a READ operation for the remaining portion (apart from the partial row) of the row data from the primary memory 120 that correspond to non-defective memory cells. In some embodiments, the READ operation is optional for the remaining portion of the row data based on the size of the memory access and the size of the partial repair.

Figure 4:
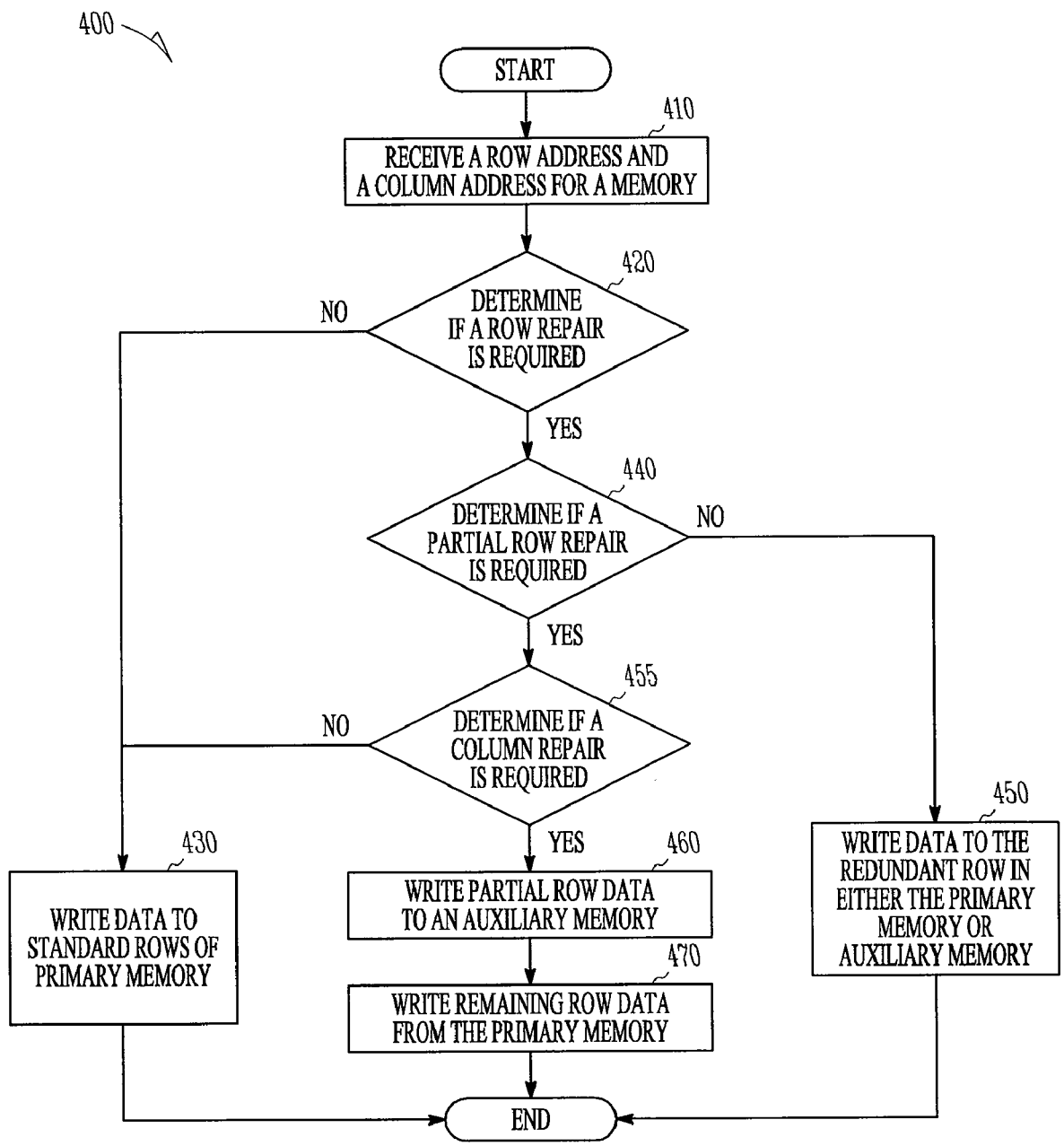
FIG. 4 is a flow chart of a method of repairing a primary memory during a WRITE operation using the system shown in FIG. 1, according to some embodiments of the invention.

FIG. 4 is a flow chart of a method 400 of repairing a primary memory during a WRITE operation using the system shown in FIG. 1, according to some embodiments of the invention.

At block 410, method 400 includes receiving a row address and a column address associated with primary memory 120. In some embodiments, at block 410, method 400 includes having the memory controller 110 provide a row address associated with primary memory 120 to tag RAM 140 using link 132 as shown in FIG. 1.

At block 420, method 400 includes determining if a row repair is required. In some embodiments, determining if a row repair is required includes checking a repair tag field 141 of a repair tag 145 associated with the received row address. In an example, if the repair tag field 141 bit has a "0" assigned to it, then the row address is determined to have no defective memory cells in the row and as a result no repair is necessary for that particular row. On the other hand, if the repair tag field 141 has a "1" assigned to it, then the row address is determined to have defective memory cells in it. Upon determining if a row repair is required at block 420, method 400 proceeds to block 430 if no repair is required, or proceeds to block 440 if a row repair is required.

At block 430, method 400 includes performing a WRITE operation to standard memory block 122 in primary memory 120. Method 400 terminates after the WRITE data operation is completed.

At block 440, method 400 includes determining if a partial row repair is required. In some embodiments, determining if a partial row repair is required includes checking a repair indicator 143 of a repair tag 145 associated with the received row address. In an example, if the repair indicator 143 bit has a "0" assigned to it, then the row address is determined as requiring a complete row repair. On the other hand, if the repair indicator 143 has a "1" assigned to it, then the row address is determined as requiring a partial row repair. Upon determining the type of repair (complete repair versus partial repair) at block 440, method 400 proceeds to block 450 if a complete repair is required. On the other hand, if a partial row repair is required, method 400 proceeds to block 455.

At block 450, method 400 includes performing a WRITE operation wherein a row data is written into either the redundant block of memory cells in the primary memory 120 or the auxiliary memory such as auxiliary data RAM 150 as determined by the state of redundant row locator 142.

At block 455, method 400 includes determining if a column repair is required. In one example, determining if a column repair is required includes comparing incoming column address 134 to bad column address field 161 to determine if a column repair is required. In an example, if a column repair is required, then method 400 proceeds to block 460. On the other hand, if no column repair is required, then method 400 proceeds to block 430.

At block 460, method 400 includes performing a WRITE operation into an auxiliary data RAM 150. Upon performing the partial row WRITE operation, method 400 proceeds to block 470.

At block 470, method 400 includes performing a WRITE operation to the primary memory 120 for the remaining portion (apart from the partial row) that corresponds to non-defective memory cells of the row.

Figure 5:
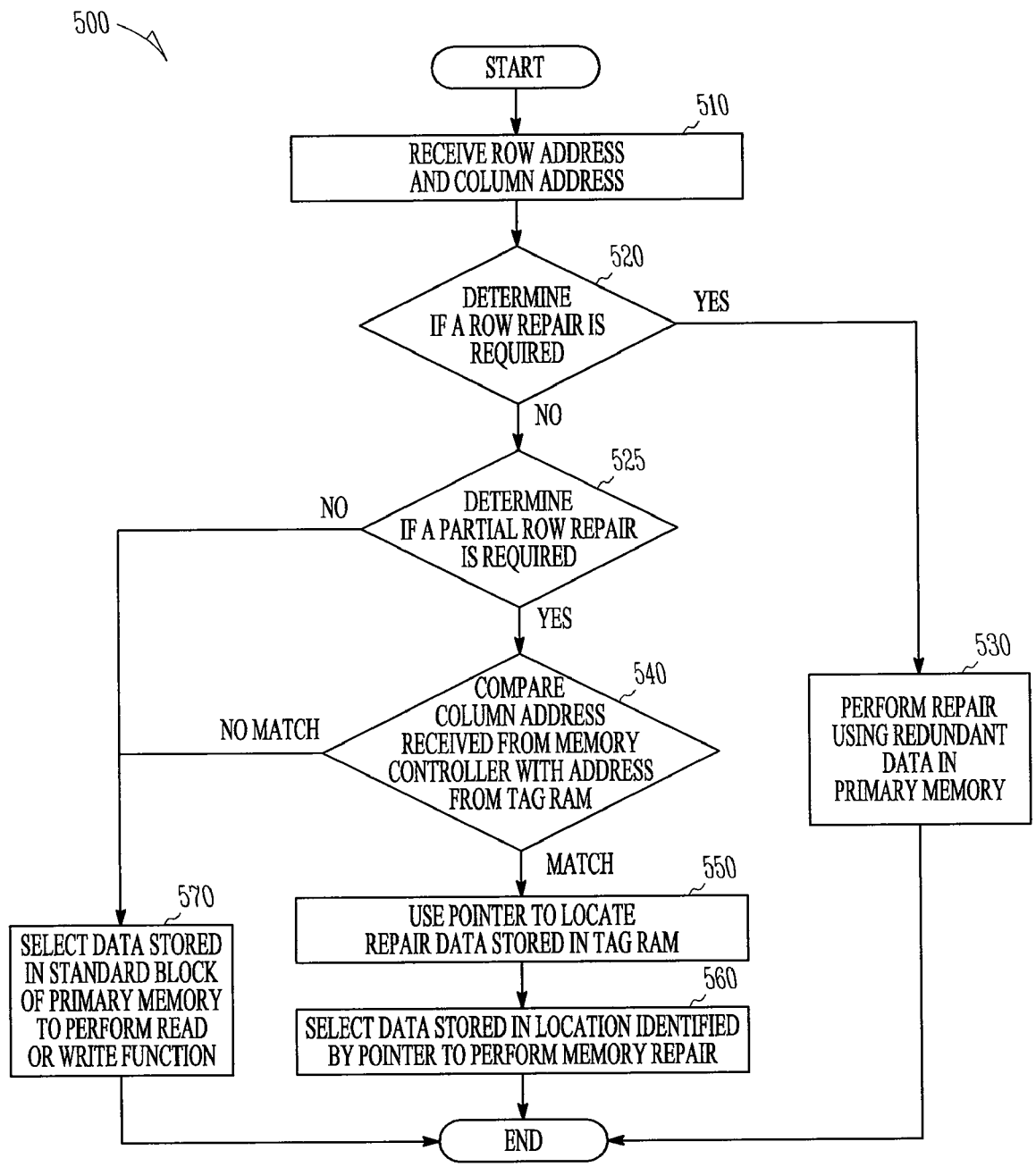
FIG. 5 is a flow chart of a method of repairing a primary memory during a READ/WRITE operation using the system shown in FIG. 2, according to some embodiments of the invention.

FIG. 5 is a flow chart of a method 500 of repairing a primary memory during a READ/WRITE operation using the system shown in FIG. 2, according to some embodiments of the invention.

At block 510, method 500 includes receiving a row address and a column address from memory controller 110 during either a READ or WRITE operation. Following block 510, method 500 proceeds to block 520.

At block 520, method 50*l* determines if a row repair is required. For example, if a bit value of "1" is present for complete repair indicator 261 or 271, the method 500 proceeds to block 530 where the repair is performed using the memory cells located in the primary memory 120. On the other hand, if a bit value "0" is present for complete row repair indicator 261 or 271, the method 500 proceeds to block 525.

At block 525, method 500 determines if a partial row repair is required. Foe example, if a bit value of "1" is present for partial repair indicator 262 or 272, the method 500 proceeds to block 540. On the other hand, if a bit value "0" is present for partial repair indicator 262, then no repair is required and the method proceeds to block 570.

At block 530, method 500 performs a complete row repair using memory cells in primary memory 120. Method 500 terminates after the repair operation is completed.

At block 540, method 500 compares the column address received on bus 134 received from memory controller 110 with a bad column address field 161 received from tag RAM 140 using bus 162. If there is no match between the two addresses that are compared, the method 500 proceeds to block 570. If there is a match upon comparison of the two addresses, then method 500 proceeds to block 550.

At block 550, method 500 uses a pointer 264 to locate repair data stored in tag RAM 240. In an example, an offset field 274 is stored at the end of the repair tag, which includes a value that can be used to identify the incremental position from the repair tag field to indicate the location where the data is located in the tag RAM 240. Upon identifying the location of the repair data in the tag RAM 240, method 500 proceeds to block 560.

At block 560, method 500 includes selecting data stored in the location identified by pointer 264 to perform memory repair. In one example, an offset field 274 stores information (such as an offset to column repair data location) for the pointer 264 to locate the memory cells within the tag RAM 240 that stores the data. In one example, offset field 274 stores values to locate redundant memory cells in tag RAM 240 that can be used to replace defective memory cells identified by address field 273.

At block 570, method 500 selects data stored in a standard block of primary memory 120 to perform either a READ or WRITE function. Method 500 terminates after a READ or WRITE function is performed in block 570.

The apparatus, systems, and methods disclosed herein can provide for increased speed and throughput while accessing memory arrays in addition to achieving a higher density of memory arrays compared to conventional designs. In some embodiments, as a result, the DRAM die size is also reduced.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein, individually or collectively, by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

CONCLUSION

Methods, apparatus and systems provided herein include performing READ, WRITE functions into a memory including a standard block of memory cells and a redundant block of memory cells, which is coupled to a repair controller in at least one such embodiment, the repair controller receives a row address and a column address associated with the memory and stores a first plurality of tag fields indicating a type of row/column repair to be performed for at least a portion of a row/column of memory cells, and a second plurality of tag fields to indicate a location of memory cells used to perform the row/column repair.

One or more embodiments provide an improved mechanism for repairing memory devices. As the storage size of a memory device is fixed, redundant rows and columns are used to repair bad rows to achieve the specified capacity. Providing redundancy maximizes the number of die that can be repaired to meet the specified capacity and thereby increasing yield. Increasing yield reduces costs of manufacturing these memory devices. Furthermore, various embodiments described herein can also improve the storage capacity of memory devices and, as a result, reduce the size of these memory devices.

What is claimed is:
1. An apparatus, comprising:
   a memory with a redundant area;
   a repair controller coupled to the memory, the repair controller including a tag random access memory (RAM) to receive an address associated with the memory, the repair controller to store a first plurality of fields, each indicating a type of repair to be performed for at least a portion of memory cells corresponding to a memory address, and a second plurality of fields, each indicating a location of at least one memory cell used to perform the repair; and
   a comparator to compare at least a portion of an address received from a memory controller with at least a portion of an address received from the tag RAM to generate a control signal based on the second plurality of fields to instruct a selector to select data from either the redundant area or an auxiliary redundant data RAM,
   wherein the tag RAM is configured to determine the type of repair for a row of the memory, and when the type of repair is a partial row repair, the tag RAM is configured to identify at least one defective column address in the row of the memory.

2. The apparatus of claim 1, wherein the repair controller includes the auxiliary redundant data RAM.

3. The apparatus of claim 2, wherein the auxiliary redundant data RAM stores data associated with defective cells.

4. The apparatus of claim 2, wherein the repair controller includes a selector to select data from either the memory or the repair controller.

5. The apparatus of claim 1, wherein the tag RAM stores the first plurality of fields and the second plurality of fields.

6. The apparatus of claim 1, wherein the partial repair is performed using data stored in the auxiliary data RAM.

7. The apparatus of claim 1, wherein the type of repair includes a complete row repair.

8. The apparatus of claim 1, wherein the complete row repair is performed using data stored in a redundant block of memory cells in the memory.

9. The apparatus of claim 1, wherein the memory includes a DRAM.

10. The apparatus of claim 1, wherein the memory includes a stack having a plurality of DRAM dice, wherein each DRAM die in the stack includes redundant block of memory cells.

11. The apparatus of claim 1, wherein the memory includes an SRAM.

12. The apparatus of claim 1, wherein the memory includes a flash memory array.

13. The apparatus of claim 1, wherein the first plurality of repair fields provide status information indicating whether a row repair is needed for a particular incoming row address.

14. A system, comprising:
a memory with a redundant area;
a repair controller coupled to the memory, the repair controller including a tag random access memory (RAM) to receive an address associated with the memory, the repair controller to store a first plurality of fields, each indicating a type of repair to be performed for at least a portion of memory cells corresponding to a memory address, and a second plurality of fields, each indicating a location of at least one memory cell used to perform the repair;
a memory controller coupled to the repair controller and the memory and to provide to the repair controller and the memory an address associated with the memory; and
a comparator to compare the address received from the memory controller with an address from the tag RAM to generate a control signal based on the second plurality of fields to instruct a selector to select data from either the redundant area or an auxiliary redundant data RAM,
wherein the tag RAM is configured to determine the type of repair for a row of the memory, and when the type of repair is a partial row repair, the tag RAM is configured to identify at least one defective column address in the row of the memory.

15. The system of claim 14, wherein the memory and the repair controller are formed within the same integrated circuit package.

16. The system of claim 14, wherein the repair controller includes a pointer to indicate the locations of at least one memory cell used to perform the repair.

17. A method comprising:
receiving a row address and a column address corresponding to memory cells of a memory device;
determining a type of repair required for the memory cells using a first field in a tag RAM in a repair controller;
determining a location of at least one memory cell associated with the repair using a second field in the repair controller;
if the type of repair is a partial row repair, then accessing a memory in the repair controller, wherein the tag RAM identifies at least one defective column address in the row of the memory; and
if the type of repair is a complete repair, then accessing a redundant block of memory cells in the memory device, wherein the column address is compared with an address from the tag RAM to generate a control signal to instruct a selector to select data based on the second field from either the redundant block of memory cells or an auxiliary redundant data RAM.

18. The method of claim 17 including identifying a bad column address for a defective cell in a row of memory cells of the memory device, if the type of repair is a partial row repair.

19. The method of claim 18, comprising comparing the bad column address with a column address received from a memory controller.

20. The method of claim 17, wherein accessing a memory in the repair controller includes retrieving data from a row of memory cells in an auxiliary data random access memory (RAM).

* * * * *